United States Patent
Ang et al.

(10) Patent No.: US 6,605,501 B1
(45) Date of Patent: Aug. 12, 2003

(54) METHOD OF FABRICATING CMOS DEVICE WITH DUAL GATE ELECTRODE

(75) Inventors: Chew-Hoe Ang, Singapore (SG); Eng-Hua Lim, Singapore (SG); Cher-Liang Cha, Singapore (SG); Jia-Zhen Zheng, Singapore (SG); Elgin Quek, Singapore (SG); Mei-Sheng Zhou, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/163,667

(22) Filed: Jun. 6, 2002

(51) Int. Cl.[7] .................... H01L 21/336; H01L 21/8238
(52) U.S. Cl. ...................... 438/212; 438/268; 438/287; 438/300; 438/304; 438/981
(58) Field of Search .................. 438/212, 216, 438/230, 231, 232, 267, 268, 275, 283, 287, 300, 303, 304, 305, 306, 981

(56) References Cited

U.S. PATENT DOCUMENTS

| | | | |
|---|---|---|---|
| 4,975,754 A | * 12/1990 | Ishiuchi et al. | 257/329 |
| 5,312,767 A | * 5/1994 | Shimizu et al. | 438/268 |
| 5,480,838 A | * 1/1996 | Mitsui | 438/270 |
| 5,633,519 A | 5/1997 | Yamazaki et al. | 257/315 |
| 5,757,038 A | 5/1998 | Tiwari et al. | 257/192 |
| 5,872,037 A | * 2/1999 | Iwamatsu et al. | 438/268 |
| 5,969,384 A | 10/1999 | Hong | 257/322 |
| 6,114,725 A | * 9/2000 | Furukawa et al. | 257/330 |
| 6,143,636 A | 11/2000 | Forbes et al. | 438/587 |
| 6,150,670 A | 11/2000 | Faltermeier et al. | 257/77 |
| 2002/0098633 A1 | * 7/2002 | Budge et al. | 438/184 |

* cited by examiner

Primary Examiner—Carl Whitehead, Jr.
Assistant Examiner—Stephen W. Smoot
(74) Attorney, Agent, or Firm—George O. Saile; Rosemary L. S. Pike; Stephen G. Stanton

(57) ABSTRACT

A method of fabricating dual gate oxide thicknesses comprising the following steps. A substrate is provided having a first pillar and a second pillar. A gate dielectric layer is formed over the substrate and the first and second pillars. First and second thin spacers are formed over the gate dielectric layer covered side walls of the first and second pillars respectively. The second pillar is masked leaving the first pillar unmasked. The first thin spacers are removed from the unmasked first pillar. The mask is removed from the masked second pillar. The structure is oxidized to convert the second thin spacers to second preliminary gate oxide over the previously masked second pillar and to form first preliminary gate oxide over the unmasked first pillar. The second gate oxide over the second pillar being thicker than the first gate oxide over the first pillar. The thinner first preliminary gate oxide is removed from over the first pillar and the thicker second preliminary gate oxide is thinned from over the second pillar. First final gate oxide is formed over the first pillar and second final gate oxide is formed on the second pillar. The second final gate oxide including the thinned second preliminary gate oxide. The second final gate oxide over the second pillar being thicker than the first final gate oxide over the first pillar.

36 Claims, 4 Drawing Sheets

METHOD OF FABRICATING CMOS DEVICE WITH DUAL GATE ELECTRODE

The present invention relates generally to fabrication of semiconductor devices, and more specifically to methods of fabricating vertical transistors.

BACKGROUND OF THE INVENTION

One way to increase chip packing density is to make vertical transistors. However, vertical transistor fabrication elevates the complexity of the process steps and conditions. This complexity is magnified when vertical transistors are fabricated with different gate oxide thicknesses for higher levels of circuitry integration.

U.S. Pat. No. 6,150,679 to Faltermeier et al. describes a process for fabricating a uniform gate oxide of a vertical transistor using ion implantation.

U.S. Pat. No. 5,969,384 to Hong describes a method of fabricating a flash memory having separate data programming and erasing terminals.

U.S. Pat. No. 5,633,519 to Yamazaki et al. describes a non-volatile floating gate semiconductor device.

U.S. Pat. No. 6,143,636 to Forbes et al. describes a method of forming a high density flash EEPROM having increased nonvolatile storage capacity.

U.S. Pat. No. 5,757,038 to Tiwari et al. describes a dual gate field effect transistor (FET) with an ultra thin channel.

SUMMARY OF THE INVENTION

Accordingly, it is an object of one ore more embodiments of the present invention to provide an improved method of fabricating vertical transistors having different gate oxide thicknesses.

Other objects will appear hereinafter.

It has now been discovered that the above and other objects of one or more embodiments of the present invention may be accomplished in the following manner. Specifically, a substrate is provided having a first pillar and a second pillar. A gate dielectric layer is formed over the substrate and the first and second pillars. First and second thin spacers are formed over the gate dielectric layer covered side walls of the first and second pillars respectively. The second pillar is masked leaving the first pillar unmasked. The first thin spacers are removed from the unmasked first pillar. The mask is removed from the masked second pillar. The structure is oxidized to convert the second thin spacers to second preliminary gate oxide over the previously masked second pillar and to form first preliminary gate oxide over the unmasked first pillar. The second gate oxide over the second pillar being thicker than the first gate oxide over the first pillar. The thinner first preliminary gate oxide is removed from over the first pillar and the thicker second preliminary gate oxide is thinned from over the second pillar. First final gate oxide is formed over the first pillar and second final gate oxide is formed on the second pillar. The second final gate oxide including the thinned second preliminary gate oxide. The second final gate oxide over the second pillar being thicker than the first final gate oxide over the first pillar.

BRIEF DESCRIPTION OF THE DRAWINGS

The features and advantages of the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, etc. may be formed or accomplished by conventional methods known in the prior art.

Initial Structure

Figure 1:
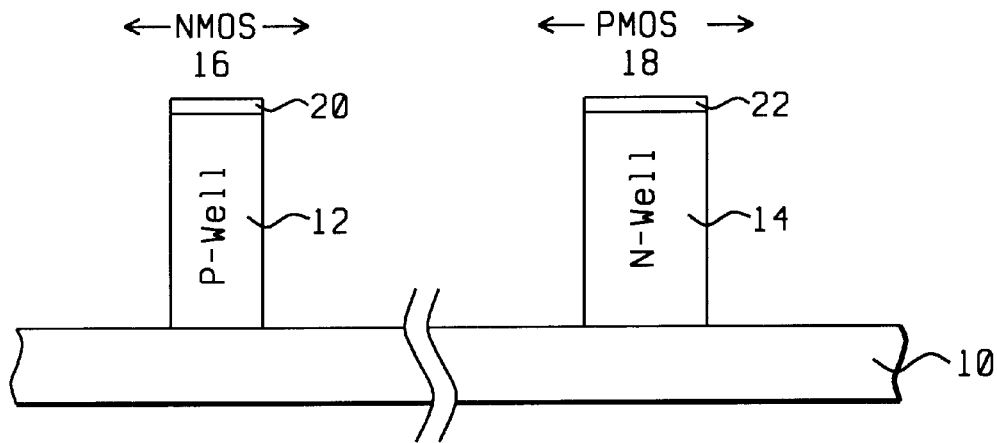
FIGS. 1 to 8 schematically illustrate in cross-sectional representation a preferred embodiment of the present invention.

FIG. 1 illustrates a cross-sectional view of a substrate 10, preferably a semiconductor silicon (Si) substrate, having first and second transistor pillars 12, 14, respectively, formed within NMOS and PMOS areas 16, 18, respectively. One of the transistor pillars 12, 14 has a P-well implant (P-well transistor pillar 12 in FIG. 1 within NMOS area 16) and the other of the transistor pillars 12, 14 has a N-well implant (N-well transistor pillar 14 in the FIG. 1 within PMOS area 18). It is noted that instead, transistor pillar 12 may have an N-well implant within a PMOS area 16 and transistor pillar 14 may have a P-well implant within an NMOS area 18.

First and second transistor pillars 12, 14 have capping, or hard mask, layers 20, 22 formed thereover to a thickness of from about 100 to 500 Å and more preferably from about 100 to 200 Å. First and second hard capping layers 20, 22 are preferably formed of nitride, silicon nitride ($Si_3N_4$), oxide, a nitride/oxide stack or a silicon nitride/oxide stack and is more preferably formed of a nitride/oxide stack.

Gate Dielectric 24 and Thin Spacer 28, 30 Formation

Figure 2:
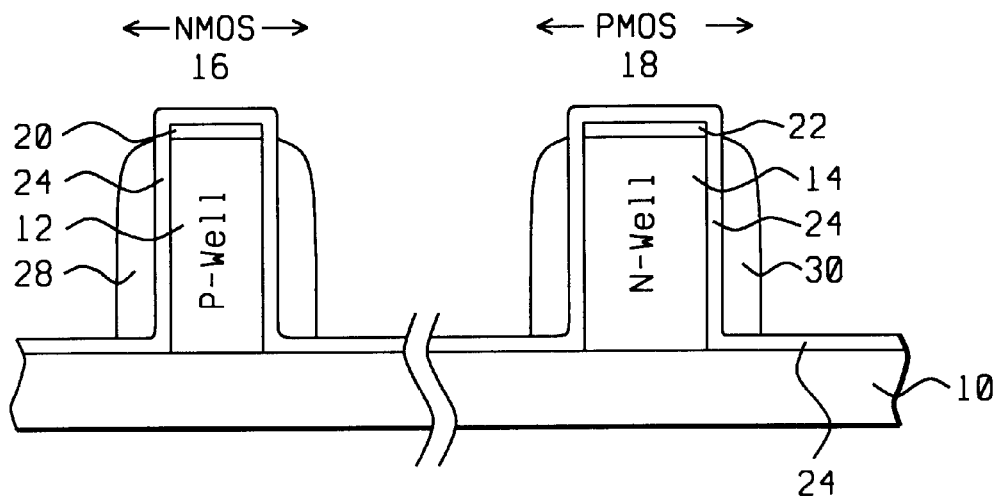

As shown in FIG. 2, gate dielectric layer 24 is formed over transistor pillars 12, 14 and substrate 10 to a thickness of preferably from about 20 to 100 Å and more preferably from about 20 to 40 Å. Gate dielectric layer 24 is preferably gate oxide formed by growth or deposition.

A thin spacer material is deposited over the structure and etched to form thin spacers 28, 30 over first and second transistor pillars 12, 14, respectively. Thin spacers 28, 30 are preferably comprised of polysilicon (poly), titanium (Ti) or tantalum (Ta) and is more preferably poly or Ti. Thin spacers 28, 30 have a base thickness of preferably from about 100 to 200, and more preferably from about 100 to 150 Å.

Masking of One of the Transistor Pillars 12, 14

Figure 3:
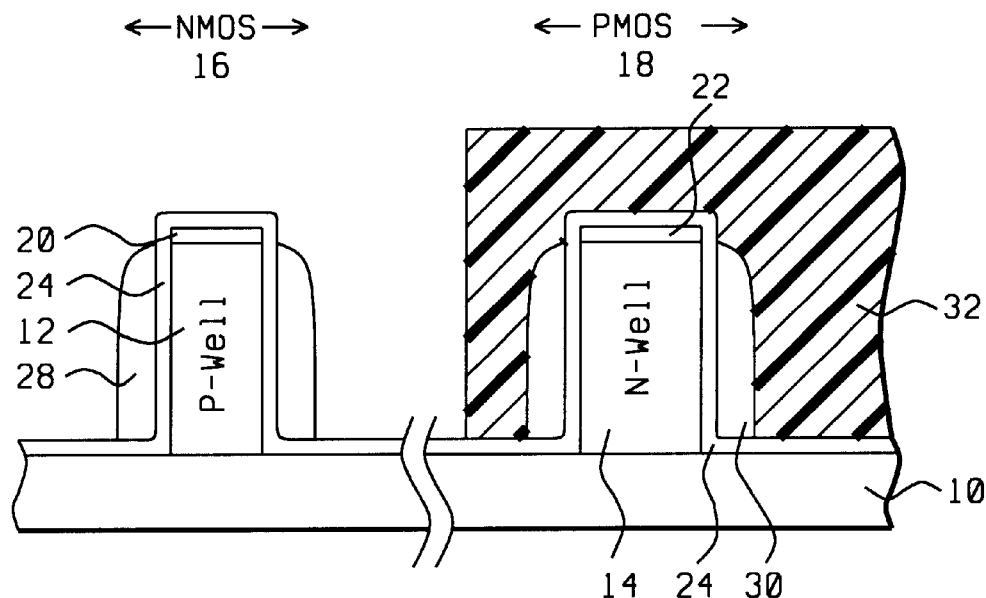

As shown in FIG. 3, one of the transistor pillars 12, 14 is masked by mask 32. As illustrated in FIG. 3, second transistor pillar 14 is masked although first transistor pillar 12 could also be masked as understood by one skilled in the art by the teachings of this invention, mask 32 completely covers the selected transistor pillar 14 pillar, overlying hard mask 22 and at least a portion of substrate 10 adjacent the selected transistor pillar 14.

Mask 32 is preferably comprised of photoresist.

Wet/Dry Unmasked Spacer 28 Etch/Removal of Mask 32

Figure 4:
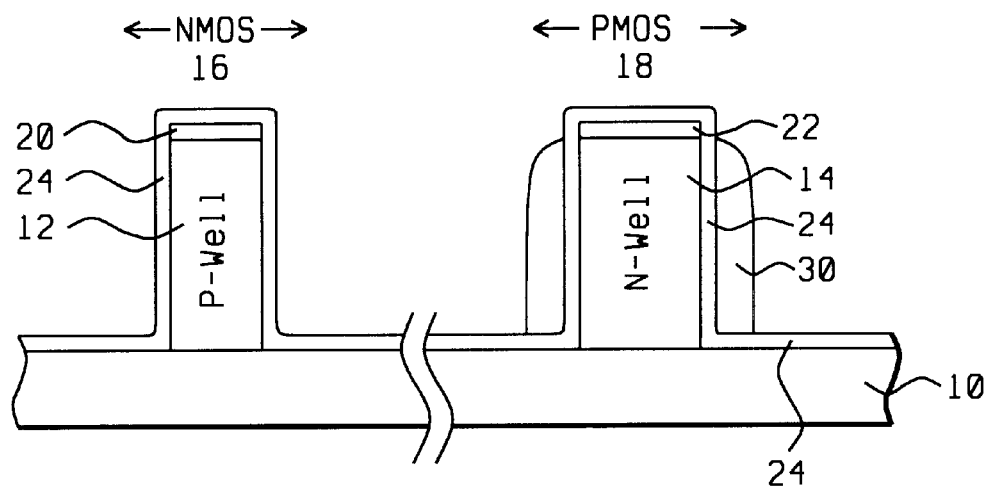

As shown in FIG. 4, the unmasked spacer, in the example illustrated in the FIGS., first transistor pillar 12 thin spacer 28, is removed, preferably by a wet/dry spacer removal process.

Mask 32 is then removed from the substrate 10 and the masked transistor pillar, second transistor pillar 14 in the example illustrated in the FIGS., preferably by stripping (such as by a chemical resist strip process) and the structure is cleaned.

Oxidation of Spacers 30 and Gate Dielectric 24 Over First Transistor Pillar 12

Figure 5:
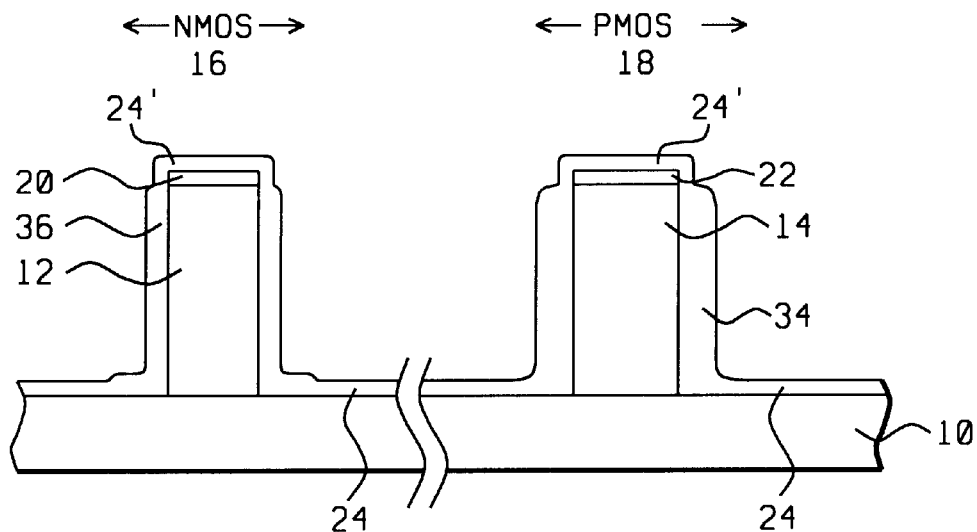

As shown in FIG. 5, an oxidation process oxidizes spacers 30 over previously masked second transistor pillar 14 and the gate dielectric 24 over first transistor pillar 12. Poly spacers 30 will transform to polyoxide while Ti spacers 30 become $TiO_x$, (high-k). In either event, thicker 'gate oxide' 34 is formed over the PMOS second transistor 14 while thinner gate oxide 36 also grows over NMOS first transistor 12.

Thicker 'gate oxide' 34 over transistor 14 is preferably from about 30 to 80 Å thick and is more preferably from about 30 to 60 Å thick. Thinner gate oxide 36 over transistor 12 is preferably from about 10 to 30 Å thick and is more preferably from about 10 to 20 Å thick.

Oxide 36, 34 Removal/Thinning Step

Figure 6:
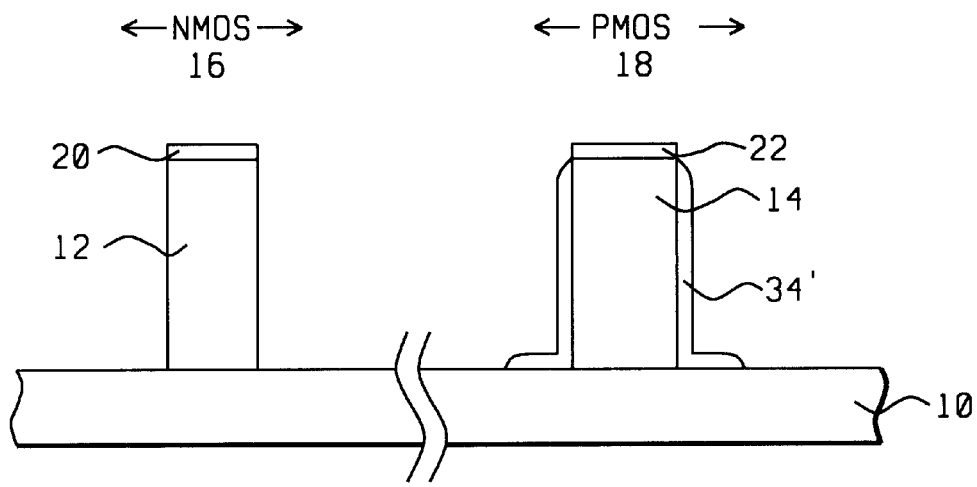

As shown in FIG. 6, an HF dip (for example) is used to remove all the gate oxide 36 over the NMOS transistor 12 and a large proportion of the 'gate oxide' 34 over the PMOS transistor 14. As shown, a portion of the 'gate oxide' 34' remains over the PMOS transistor 14 having a thickness of preferably from about 30 to 70 Å and more preferably from about 30 to 50 Å.

Formation of Final Gate Oxide 40, 42 Over First Pillar 12 and Second Pillar 14

Figure 7:
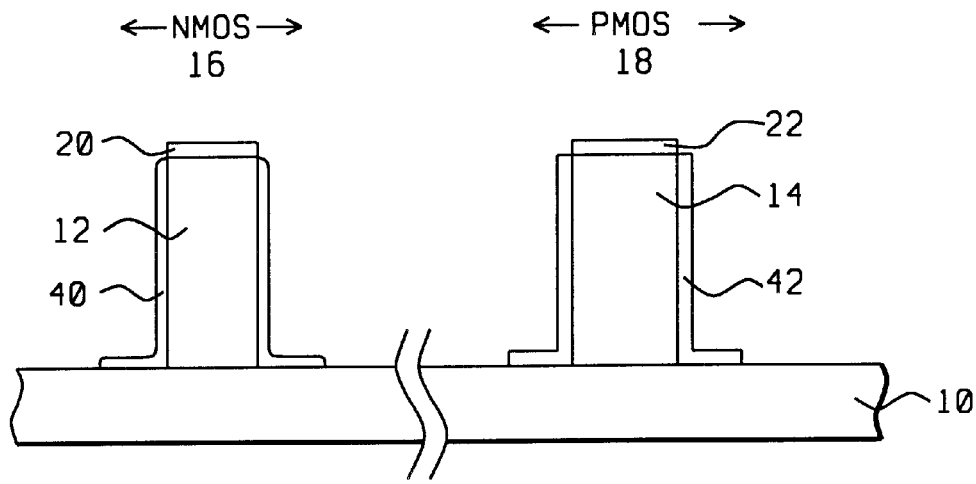

As shown in FIG. 7, final gate oxide 40, 42 is formed over first transistor pillar 12 and second transistor pillar 14, respectively. The final gate oxide 40, 42 is preferably formed by a rapid thermal oxidation process or a remote oxygen plasma growth process.

The final gate oxide 40 over the NMOS first transistor pillar 12 is thinner than the final gate oxide 42 over the PMOS second transistor pillar 14 since the final gate oxide 42 over the PMOS second transistor pillar 14 includes the remaining 'gate oxide' 34' over the second pillar 14 after the HF dip step.

Thicker final gate oxide 42 over transistor 14 is preferably from about 30 to 80 Å thick and is more preferably from about 30 to 60 Å thick. Thinner gate oxide 40 over transistor 12 is preferably from about 10 to 30 Å thick and is more preferably from about 10 to 20 Å thick.

Removal of Capping Layers 20, 22 and Self-Aligned Ion Implantation

Figure 8:
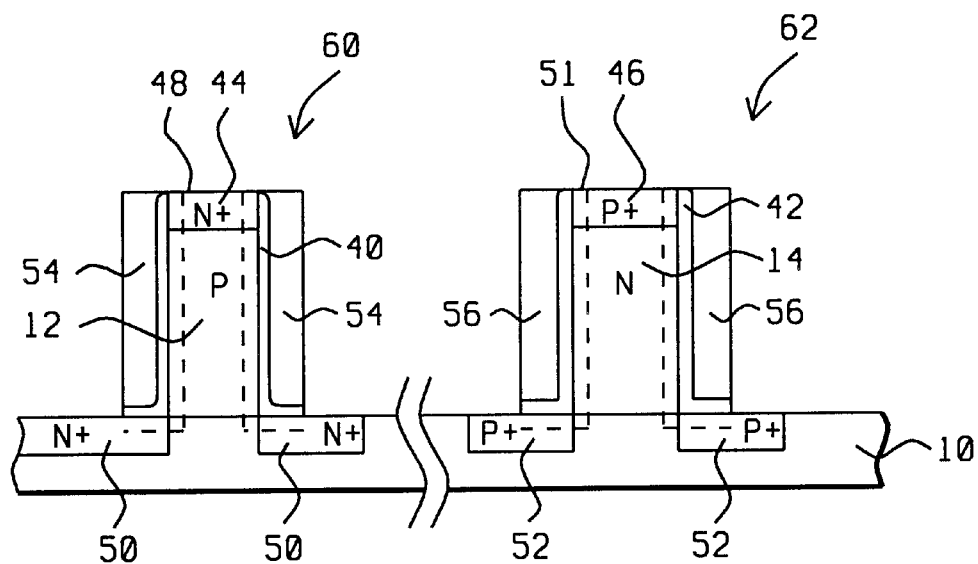

As shown in FIG. 8, completion of transistors 44, 46 may then be accomplished as follows, for example.

Capping layers 20, 22 are removed from first and second transistor pillars 12, 14, respectively, exposing the top surfaces 48, 46 of first and second transistor pillars 12, 14, respectively.

Source implants 44, 46 are formed by self-aligned ion implantation through the exposed top portions 48, 51 of first and second pillars 12, 14. Drain implants 50, 52 are formed by self-aligned ion implantation within substrate 10 at the base of, and extending from, first and second pillars 12, 14, respectively.

Gate regions 54 are formed over the final thinner gate oxide 40 of first pillar 12 and gate regions 56 are formed over the final thicker gate oxide 42 of second pillar 14. Gate regions 54, 56 are preferably comprised of polysilicon, doped polysilicon (for control of the gate work function), tungsten, tungsten-silicon alloys, or aluminum and are more preferably doped polysilicon (for control of the gate work function).

This completes formation of first and second transistors 60, 62 having dual gate oxide 40, 42 thicknesses, respectively.

ADVANTAGES OF THE INVENTION

One advantage of one or more embodiments of the present invention is that dual gate oxide thickness is formed upon vertical transistors.

While particular embodiments of the present invention have been illustrated and described, it is not intended to limit the invention, except as defined by the following claims.

We claim:

1. A method of fabricating dual gate oxide thicknesses, comprising the steps of:

providing a substrate having a first pillar and a second pillar; the first and second pillars each having side walls;

forming a gate dielectric layer over the substrate, the first and second pillars and the side walls of the first and second pillars;

forming first and second thin spacers over the gate dielectric layer covered side walls of the first and second pillars, respectively;

masking the second pillar leaving the first pillar unmasked;

removing the first thin spacers from the unmasked first pillar;

removing the mask from the masked second pillar;

oxidizing the structure to convert the second thin spacers to second preliminary gate oxide over the previously masked second pillar and to form first preliminary gate oxide over the unmasked first pillar; the second gate oxide over the second pillar being thicker than the first gate oxide over the first pillar;

removing the thinner first preliminary gate oxide from over the first pillar and thinning the thicker second preliminary gate oxide from over the second pillar; and forming first final gate oxide over the first pillar and second final gate oxide on the second pillar; the second final gate oxide including the thinned second preliminary gate oxide; the second final gate oxide over the second pillar being thicker than the first final gate oxide over the first pillar.

2. The method of claim 1, including the steps of:

forming capping layers over first and second pillars, respectively, before formation of the gate dielectric layer; and removing the capping layers after formation of first and second final gate oxide on the first and second pillars, respectively.

3. The method of claim 1, including the steps of:

forming capping layers over first and second pillars, respectively, before formation of the gate dielectric layer; and removing the capping layers after formation of first and second final gate oxide on the first and second pillars, respectively; the capping layers being comprised of a material selected from the group consisting of nitride, silicon nitride, oxide, a nitride/oxide stack and a silicon nitride/oxide stack.

4. The method of claim 1, including the steps of:

forming capping layers over first and second pillars, respectively, before formation of the gate dielectric layer; and removing the capping layers after formation of first and second final gate oxide on the first and second pillars, respectively; the capping layers being comprised of a nitride/oxide stack.

5. The method of claim 1, including the steps of:
   forming source implants in the first and second pillars, respectively;
   forming drain implants within substrate; and
   forming gate regions over the first and second pillars, respectively.

6. The method of claim 1, wherein the substrate and the first and second pillars are comprised of silicon; the gate dielectric layer is comprised of oxide; the first and second thin spacers are comprised of a material selected from the group consisting of polysilicon, Ti and Ta; the mask is comprised of photoresist; and the second preliminary gate oxide over the previously masked second pillar is comprised of a material selected from the group consisting of polyoxide, $TiO_x$ and $TaO_x$.

7. The method of claim 1, wherein the substrate and the first and second pillars are comprised of silicon; the gate dielectric layer is comprised of oxide; the first and second thin spacers are comprised of a material selected from the group consisting of polysilicon and Ti; the mask is comprised of photoresist; and the second preliminary gate oxide over the previously masked second pillar is comprised of a material selected from the group consisting of polyoxide and $TiO_x$.

8. The method of claim 1, including the steps of:
   forming capping layers over first and second pillars, respectively, before formation of the gate dielectric layer; and
   removing the capping layers after formation of first and second final gate oxide on the first and second pillars, respectively; the capping layers having a thickness of from about 100 to 500 Å.

9. The method of claim 1, including the steps of:
   forming capping layers over first and second pillars, respectively, before formation of the gate dielectric layer; and
   removing the capping layers after formation of first and second final gate oxide on the first and second pillars, respectively; the capping layers having a thickness of from about 100 to 200 Å.

10. The method of claim 1, wherein the gate dielectric layer has a thickness of from about 20 to 100 Å; the first and second thin spacers each have a base thickness of from about 100 to 200 Å; the first preliminary gate oxide has a thickness of from about 10 to 30 Å; the second preliminary gate oxide has a thickness of from about 30 to 80 Å; the thinned second preliminary gate oxide has a thickness of from about 30 to 70 Å; the first final gate oxide over the first pillar has a thickness of from about 10 to 30 Å; and the second final gate oxide over the second pillar has a thickness of from about 30 to 80 Å.

11. The method of claim 1, wherein the gate dielectric layer has a thickness of from about 20 to 40 Å; the first and second thin spacers each have a base thickness of from about 100 to 150 Å; the first preliminary gate oxide has a thickness of from about 10 to 20 Å; the second preliminary gate oxide has a thickness of from about 30 to 60 Å; the thinned second preliminary gate oxide has a thickness of from about 30 to 50 Å; the first final gate oxide over the first pillar has a thickness of from about 10 to 20 Å; and the second final gate oxide over the second pillar has a thickness of from about 30 to 60 Å.

12. The method of claim 1, wherein the removal of the first thin spacers from the unmasked first pillar is accomplished by a process selected from the group consisting of a wet spacer removal process and a dry spacer removal process; and the formation of the first and second final gate oxides is accomplished by a process selected from the group consisting of a rapid thermal oxidation process and a remote oxygen plasma growth process.

13. A method of fabricating dual gate oxide thicknesses, comprising the steps of:
   providing a substrate having a first pillar and a second pillar; the first and second pillars having respective capping layers thereover and respective side walls;
   forming a gate dielectric layer over the substrate, the first and second pillars and the side walls of the first and second pillars;
   forming first and second thin spacers over the gate dielectric layer covered side walls of the first and second pillars, respectively;
   masking the second pillar leaving the first pillar unmasked;
   removing the first thin spacers from the unmasked first pillar;
   removing the mask from the masked second pillar;
   oxidizing the structure to convert the second thin spacers to second preliminary gate oxide over the previously masked second pillar and to form first preliminary gate oxide over the unmasked first pillar; the second gate oxide over the second pillar being thicker than the first gate oxide over the first pillar;
   removing the thinner first preliminary gate oxide from over the first pillar and thinning the thicker second preliminary gate oxide from over the second pillar; and
   forming first final gate oxide over the first pillar and second final gate oxide on the second pillar; the second final gate oxide including the thinned second preliminary gate oxide; the second final gate oxide over the second pillar being thicker than the first final gate oxide over the first pillar.

14. The method of claim 13, including the step of removing the capping layers after formation of first and second final gate oxide on the first and second pillars, respectively.

15. The method of claim 13, including the step of removing the capping layers after formation of first and second final gate oxide on the first and second pillars, respectively; the capping layers being comprised of a material selected from the group consisting of nitride, silicon nitride, oxide, a nitride/oxide stack and a silicon nitride/oxide stack.

16. The method of claim 13, including the step of removing the capping layers after formation of first and second final gate oxide on the first and second pillars, respectively; the capping layers being comprised of a nitride/oxide stack.

17. The method of claim 13, including the steps of:
   forming source implants in the first and second pillars, respectively;
   forming drain implants within substrate; and
   forming gate regions over the first and second pillars, respectively.

18. The method of claim 13, wherein the substrate and the first and second pillars are comprised of silicon; the gate dielectric layer is comprised of oxide; the first and second thin spacers are comprised of a material selected from the group consisting of polysilicon, Ti and Ta; the mask is comprised of photoresist; the second preliminary gate oxide over the previously masked second pillar is comprised of a material selected from the group consisting of polyoxide, $TiO_x$ and $TaO_x$.

19. The method of claim 13, wherein the substrate and the first and second pillars are comprised of silicon; the gate dielectric layer is comprised of oxide; the first and second thin spacers are comprised of a material selected from the group consisting of polysilicon and Ti; the mask is comprised of photoresist; the second preliminary gate oxide over the previously masked second pillar is comprised of a material selected from the group consisting of polyoxide and $TiO_x$.

20. The method of claim 13, including the step of removing the capping layers after formation of first and second final gate oxide on the first and second pillars, respectively; the capping layers having a thickness of from about 100 to 500 Å.

21. The method of claim 13, including the step of removing the capping layers after formation of first and second final gate oxide on the first and second pillars, respectively; the capping layers having a thickness of from about 100 to 200 Å.

22. The method of claim 13, wherein the gate dielectric layer has a thickness of from about 20 to 100 Å; the first and second thin spacers each have a base thickness of from about 100 to 200 Å; the first preliminary gate oxide has a thickness of from about 10 to 30 Å; the second preliminary gate oxide has a thickness of from about 30 to 80 Å; the thinned second preliminary gate oxide has a thickness of from about 30 to 70 Å; the first final gate oxide over the first pillar has a thickness of from about 10 to 30 Å; and the second final gate oxide over the second pillar has a thickness of from about 30 to 80 Å.

23. The method of claim 13, wherein the gate dielectric layer has a thickness of from about 20 to 40 Å; the first and second thin spacers each have a base thickness of from about 100 to 150 Å; the first preliminary gate oxide has a thickness of from about 10 to 20 Å; the second preliminary gate oxide has a thickness of from about 30 to 60 Å; the thinned second preliminary gate oxide has a thickness of from about 30 to 50 Å; and the first final gate oxide over the first pillar has a thickness of from about 10 to 20 Å; and the second final gate oxide over the second pillar has a thickness of from about 30 to 60 Å.

24. The method of claim 13, wherein the removal of the first thin spacers from the unmasked first pillar is accomplished by a process selected from the group consisting of a wet spacer removal process and a dry spacer removal process; and the formation of the first and second final gate oxides is accomplished by a process selected from the group consisting of a rapid thermal oxidation process and a remote oxygen plasma growth process.

25. A method of fabricating dual gate oxide thicknesses, comprising the steps of:
   providing a substrate having a first pillar and a second pillar; the first and second pillars having respective capping layers thereover and respective side walls; the capping layers being comprised of a material selected from the group consisting of nitride, silicon nitride, oxide, a nitride/oxide stack and a silicon nitride/oxide stack;
   forming a gate dielectric layer over the substrate, the first and second pillars and the side walls of the first and second pillars;
   forming first and second thin spacers over the gate dielectric layer covered side walls of the first and second pillars, respectively;
   masking the second pillar leaving the first pillar unmasked;
   removing the first thin spacers from the unmasked first pillar;
   removing the mask from the masked second pillar;
   oxidizing the structure to convert the second thin spacers to second preliminary gate oxide over the previously masked second pillar and to form first preliminary gate oxide over the unmasked first pillar; the second gate oxide over the second pillar being thicker than the first gate oxide over the first pillar;
   removing the thinner first preliminary gate oxide from over the first pillar and thinning the thicker second preliminary gate oxide from over the second pillar; and
   forming first final gate oxide over the first pillar and second final gate oxide on the second pillar; the second final gate oxide including the thinned second preliminary gate oxide; the second final gate oxide over the second pillar being thicker than the first final gate oxide over the first pillar.

26. The method of claim 25, including the step of removing the capping layers after formation of first and second final gate oxide on the first and second pillars, respectively.

27. The method of claim 25, including the step of removing the capping layers after formation of first and second final gate oxide on the first and second pillars, respectively.

28. The method of claim 25, including the step of removing the capping layers after formation of first and second final gate oxide on the first and second pillars, respectively; the capping layers being comprised of a nitride/oxide stack.

29. The method of claim 25, including the steps of:
   forming source implants in the first and second pillars, respectively;
   forming drain implants within substrate; and
   forming gate regions over the first and second pillars, respectively.

30. The method of claim 25, wherein the substrate and the first and second pillars are comprised of silicon; the gate dielectric layer is comprised of oxide; the first and second thin spacers are comprised of a material selected from the group consisting of polysilicon, Ti and Ta; the mask is comprised of photoresist; the second preliminary gate oxide over the previously masked second pillar is comprised of a material selected from the group consisting of polyoxide, $TiO_x$ and $TaO_x$.

31. The method of claim 25, wherein the substrate and the first and second pillars are comprised of silicon; the gate dielectric layer is comprised of oxide; the first and second thin spacers are comprised of a material selected from the group consisting of polysilicon and Ti; the mask is comprised of photoresist; the second preliminary gate oxide over the previously masked second pillar is comprised of a material selected from the group consisting of polyoxide and $TiO_x$.

32. The method of claim 25, including the step of removing the capping layers after formation of first and second final gate oxide on the first and second pillars, respectively; the capping layers having a thickness of from about 100 to 500 Å.

33. The method of claims 25, including the step of removing the capping layers after formation of first and second final gate oxide on the first and second pillars, respectively; the capping layers having a thickness of from about 100 to 200 Å.

34. The method of claim 25, wherein the gate dielectric layer has a thickness of from about 20 to 100 Å; the first and second thin spacers each have a base thickness of from about 100 to 200 Å; the first preliminary gate oxide has a thickness of from about 10 to 30 Å; the second preliminary gate oxide has a thickness of from about 30 to 80 Å; the thinned second preliminary gate oxide has a thickness of from about 30 to 70 Å; the first final gate oxide over the first pillar has a thickness of from about 10 to 30 Å; and the second final gate oxide over the second pillar has a thickness of from about 30 to 80 Å.

35. The method of claim 25, wherein the gate dielectric layer has a thickness of from about 20 to 40 Å; the first and second thin spacers each have a base thickness of from about 100 to 150 Å; the first preliminary gate oxide has a thickness of from about 10 to 20 Å; the second preliminary gate oxide has a thickness of from about 30 to 60 Å; the thinned second preliminary gate oxide has a thickness of from about 30 to 50 Å; and the first final gate oxide over the first pillar has a thickness of from about 10 to 20 Å; and the second final gate oxide over the second pillar has a thickness of from about 30 to 60 Å.

36. The method of claim 25, wherein the removal of the first thin spacers from the masked first pillar is accomplished by a process selected from the group sisting of a wet spacer removal process and a dry spacer removal process; and formation of the first and second final gate oxides is accomplished by a process ected from the group consisting of a rapid thermal oxidation process and a remote oxygen plasma growth process.

* * * * *

UNITED STATES PATENT AND TRADEMARK OFFICE
CERTIFICATE OF CORRECTION

PATENT NO.    : 6,605,501 B1                                              Page 1 of 1
DATED         : August 12, 2003
INVENTOR(S)   : Chew-Hoe Ang et al.

It is certified that error appears in the above-identified patent and that said Letters Patent is hereby corrected as shown below:

<u>Title page,</u>
Item [75], delete "Cher-Liang Cha" and replace with -- Randell Cher-Liang Cha --; and add -- Daniel Yen --.

Signed and Sealed this

Second Day of December, 2003

JAMES E. ROGAN
*Director of the United States Patent and Trademark Office*